United States Patent
Ditri et al.

(12)

(10) Patent No.: US 6,581,486 B1
(45) Date of Patent: Jun. 24, 2003

(54) INTEGRATED CIRCUIT TESTER HAVING A FAIL-SAFE MECHANISM FOR MOVING IC-CHIPS

(75) Inventors: David John Ditri, Oceanside, CA (US); Ronald Allen Norell, Oceanside, CA (US); James Mason Brafford, Mission Viejo, CA (US)

(73) Assignee: Unisys Corporation, Blue Bell, PA (US)

( * ) Notice: Subject to any disclaimer, the term of this patent is extended or adjusted under 35 U.S.C. 154(b) by 85 days.

(21) Appl. No.: 09/976,416

(22) Filed: Oct. 11, 2001

(51) Int. Cl.[7] ............................................. F16H 25/20
(52) U.S. Cl. .................. 74/89.39; 74/89.37; 74/89.23; 324/758; 414/222.01; 187/267
(58) Field of Search ....................... 324/758; 248/125.3, 248/125.1, 638, 669; 187/267, 268, 214; 182/141; 74/89.23, 89.34, 89.37, 89.39; 254/89 R, 98, 102, 96; 414/222.01, 222.05, 226.04

(56) References Cited

U.S. PATENT DOCUMENTS

| | | | | |
|---|---|---|---|---|
| 2,624,535 A | * | 1/1953 | Bollhoefer | 248/669 |
| 3,336,925 A | * | 8/1967 | Thompson | 74/89.23 |
| 3,928,946 A | * | 12/1975 | Wynn | 451/259 |
| 4,405,116 A | * | 9/1983 | Eisenberg | 254/122 |
| 5,746,138 A | * | 5/1998 | Hirose | 108/145 |
| 5,996,961 A | * | 12/1999 | Johnson | 248/669 |
| 6,015,131 A | * | 1/2000 | Brewer, III | 248/638 |
| 6,130,547 A | * | 10/2000 | Kato | 324/761 |
| 6,307,388 B1 | * | 10/2001 | Friedrich et al. | 324/754 |
| 6,325,662 B1 | * | 12/2001 | Tustaniwskyj | 324/754 |
| 6,522,156 B2 | * | 2/2003 | Tustaniwskyj et al. | 324/754 |

* cited by examiner

*Primary Examiner*—Rodney H. Bonck
*Assistant Examiner*—Eric M. Williams
(74) *Attorney, Agent, or Firm*—Charles J. Fassbender; Mark T. Starr; Lise A. Rode

(57) ABSTRACT

An integrated circuit tester includes a fail-safe mechanism for moving an integrated circuit chip between an initial position where the integrated circuit chip is inserted into the tester, and a test position where the integrated circuit chips is actually tested. This fail-safe mechanism includes a motor and a shaft which the motor rotates to move the integrated circuit chip. An electronic control circuit can be included to automatically stop the motor when the integrated circuit reaches its initial position, or its test position; but if the control circuit fails to operate properly, then damage to the integrated circuit tester is prevented by the fail-safe mechanism.

10 Claims, 10 Drawing Sheets

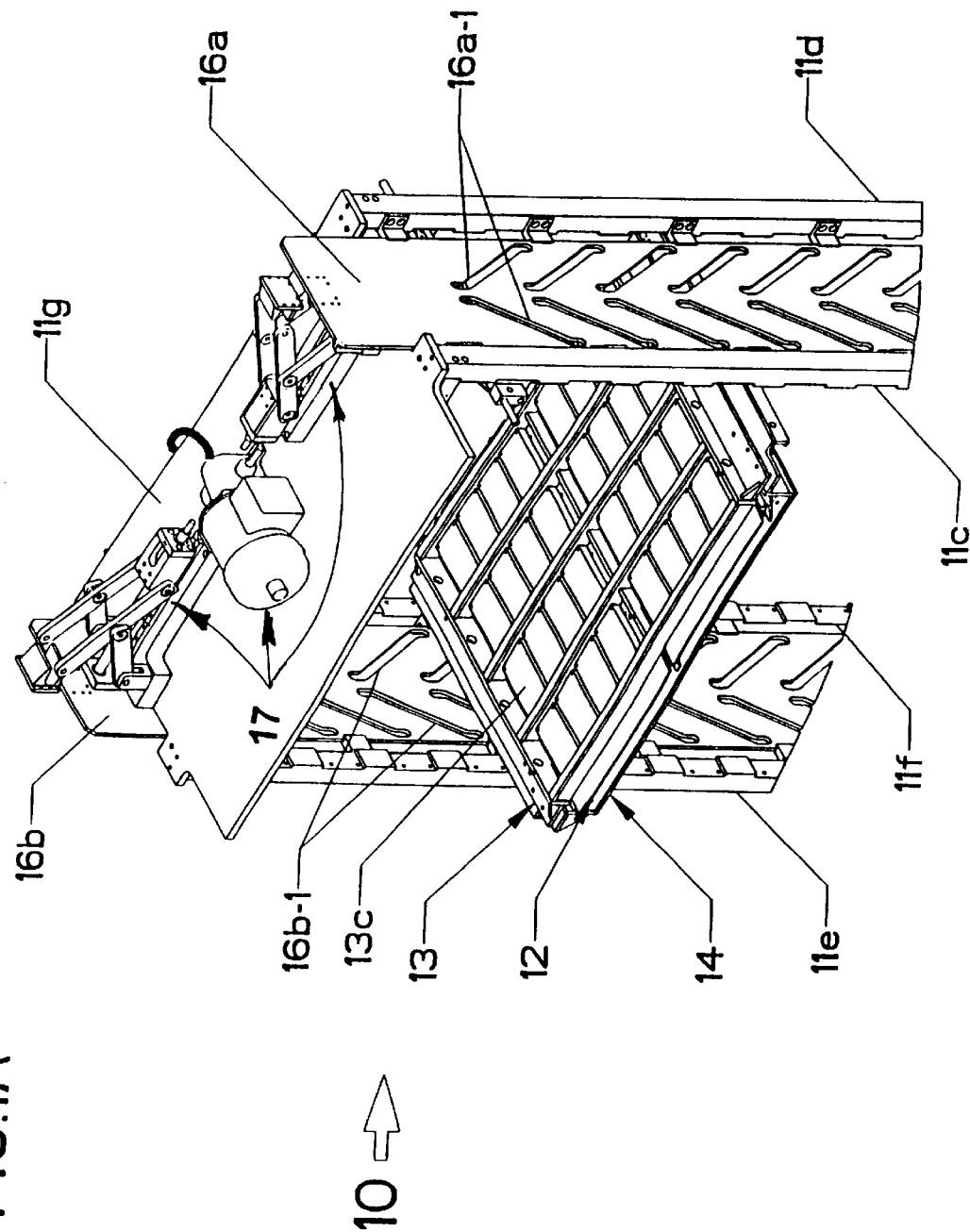

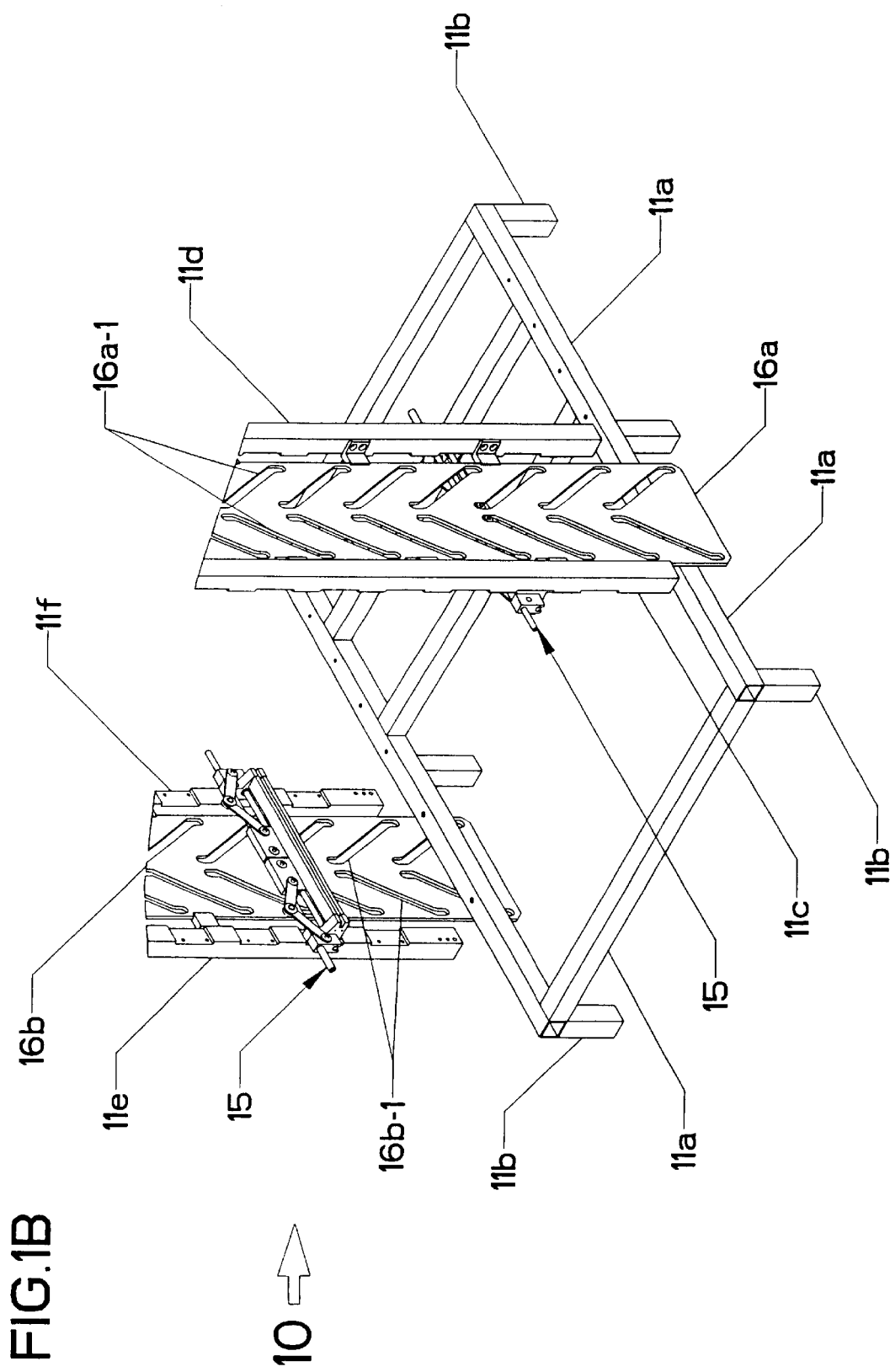

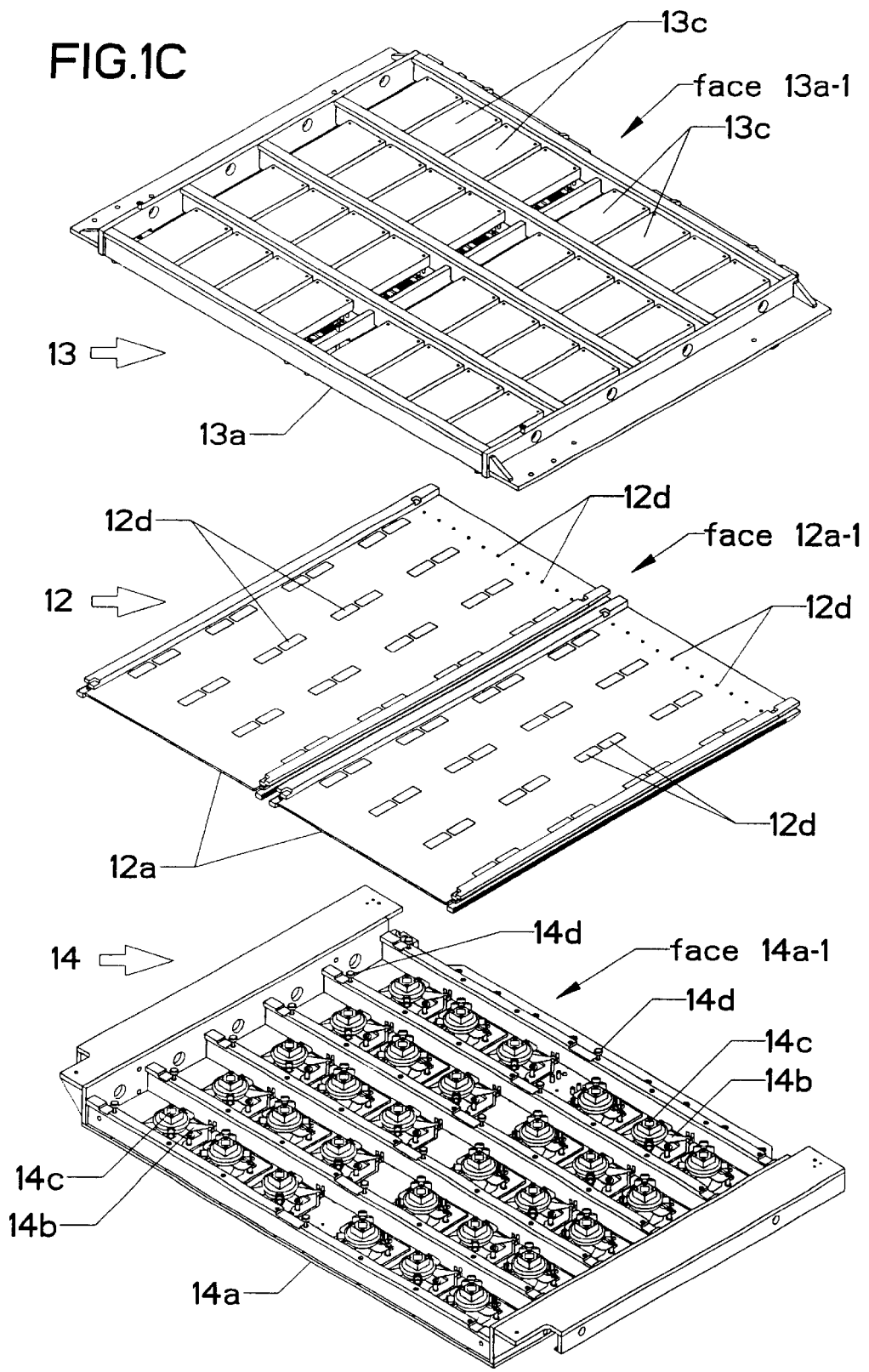

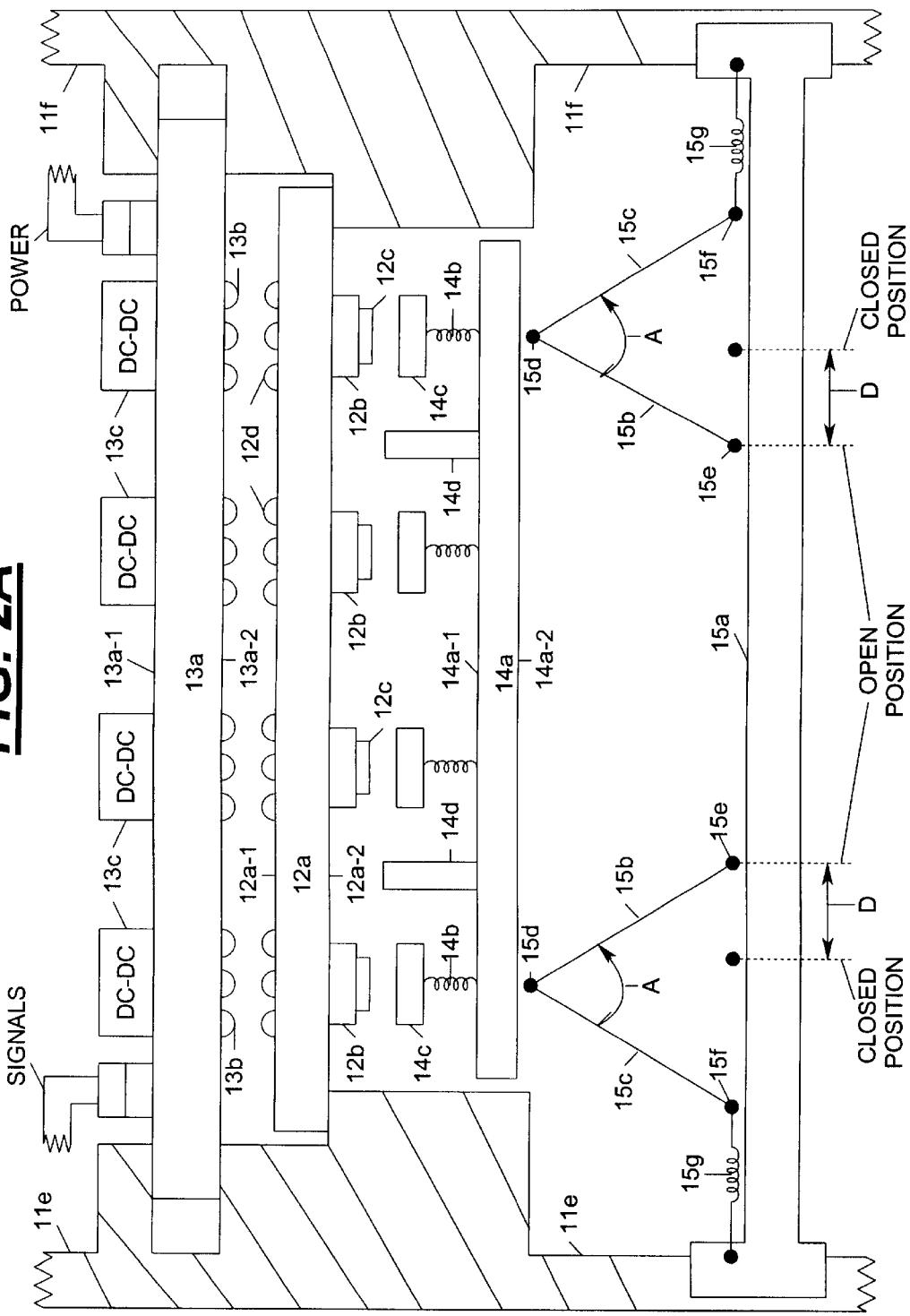

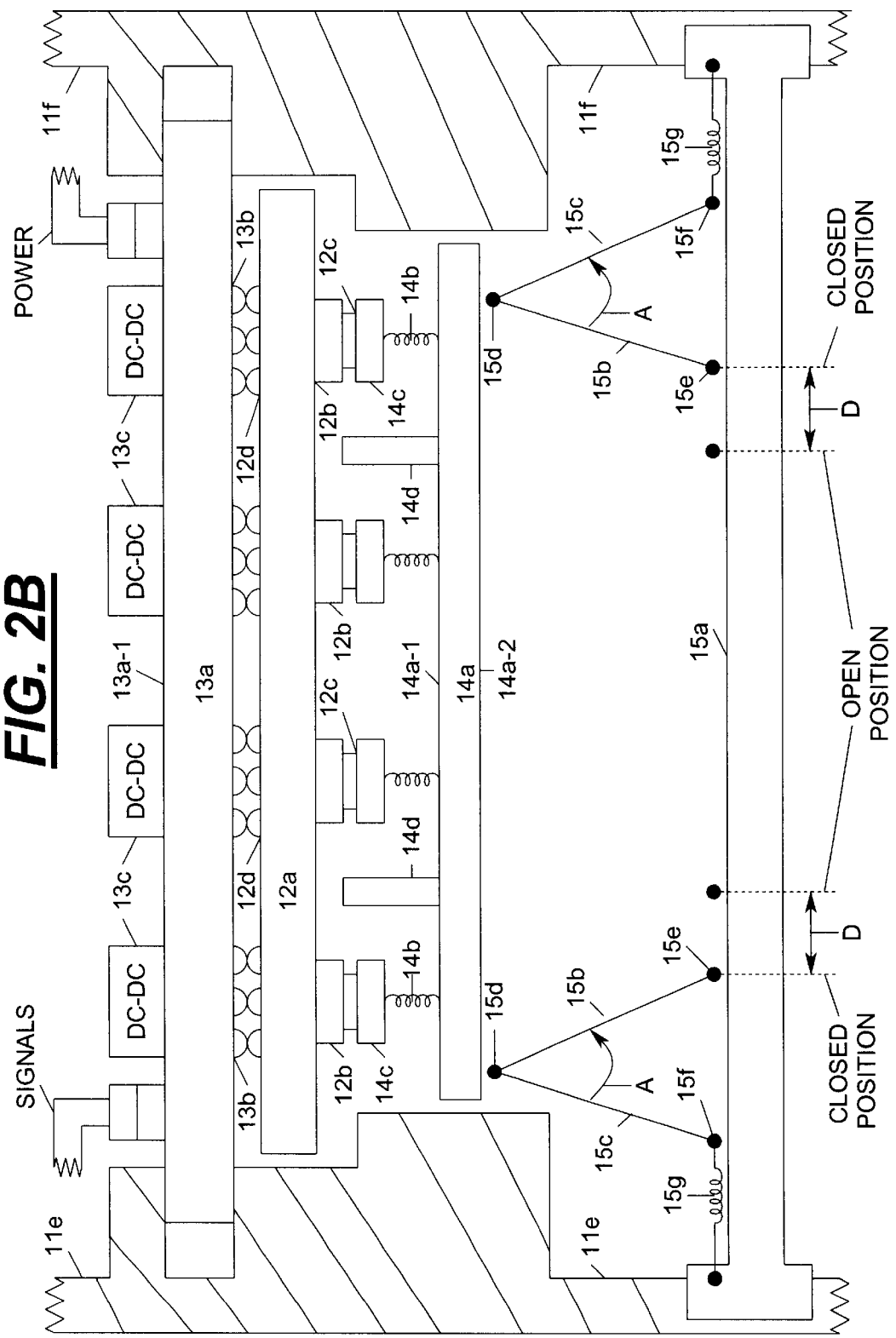

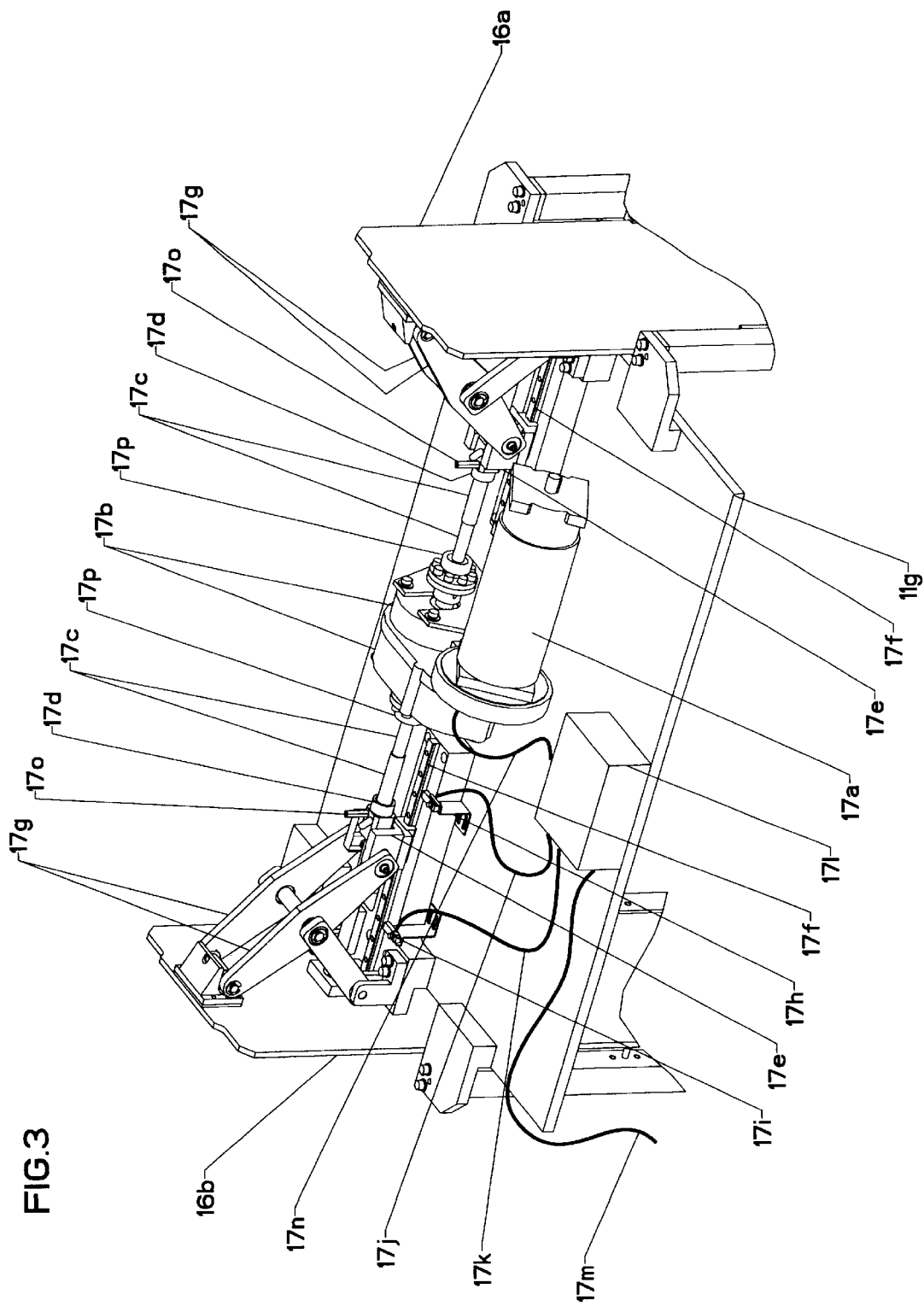

INTEGRATED CIRCUIT TESTER HAVING A
FAIL-SAFE MECHANISM FOR MOVING
IC-CHIPS

BACKGROUND OF THE INVENTION

The present invention relates to integrated circuit testers for testing IC-chips (integrated circuit chips). More particularly, the present invention relates to integrated circuit testers which include a fail-safe mechanism for moving an IC-chip between an initial position where the IC-chip is inserted into the tester and a test position where the IC-chip is actually tested.

Typically, a single IC-chip contains more than one-hundred-thousand transistors. Thus, a manufacturer of IC-chips must test their IC-chips to ensure that they operate properly before they are sold to a customer. Conventionally, this testing is accomplished as follows.

Initially, one group of IC-chips that are to be tested are placed in respective sockets that are mounted on several printed circuit boards. Each printed circuit board has edge connectors on one edge of the board; and those connectors carry test signals, as well as DC electrical power, for the IC-chips that are in the sockets.

After the IC-chips are placed in the sockets, the printed circuit boards are inserted into fixed slots in an electromechanical apparatus where the chip testing occurs. As each printed circuit board is inserted into a slot, the edge connectors on the board plug into mating connectors that are provided in the slot.

Usually, several printed circuit boards are held in the slots, spaced-apart from each other, in a horizontal row. Alternatively, several printed circuit boards can be held in the slots, spaced-apart from each other, in a vertical column.

Multiple signal lines are provided in the IC-chip testing apparatus which extend from the connectors in the slots to a test signal controller. This controller tests the IC-chips by sending them test signals and receiving responses from them. Also, electrical power lines are provided in the IC-chip testing apparatus which extend from the connectors in the slots to one or more power supplies.

Often it is desirable to perform a "burn-in" test wherein the IC-chips are held at a high temperature while they are tested. In the prior art, that was done by enclosing the IC-chip testing apparatus in an oven and providing fans in the enclosure which circulate hot air past the IC-chips while they are tested.

However, one drawback with the above prior art testing apparatus is that the temperature at which the IC-chips are tested cannot be regulated accurately. This inaccuracy is caused, in part, by variations in the temperature and velocity of the air which flows past each of the IC-chips. Also, the inaccuracy is caused by variations in power dissipation which occurs within the IC-chips while they are being tested, and this problem gets worse as the magnitude of the power variations increase.

Further, another drawback with the above prior art IC-chip testing apparatus is that due to the row/column arrangement of the printed circuit boards, a large distance inherently exists between the IC-chips that are tested and the power supplies for those IC-chips. Due to those large distances, parasitic resistances, parasitic inductances and parasitic capacitances are inherently large; and thus, the more difficult it becomes to keep the IC-chip voltages constant while IC-chip power dissipation changes rapidly.

To avoid the above technical problems, a novel architecture for an IC-chip testing apparatus has been developed wherein an IC-chip holding subassembly, a power converter subassembly, and a temperature regulating subassembly are squeezed together in multiple sets by respective pressing mechanisms. One major benefit which is achieved with this architecture is that by pressing the temperature regulating subassembly against the IC-chip holding subassembly, heat can be added/removed from the IC-chips by conduction; and thus the temperature of the IC-chips can be regulated accurately. Another major benefit which is achieved with this architecture is that by pressing the power converter subassembly against the IC-chip holding subassembly, the distance between the IC-chips and their power supplies is made small; and, consequently, the IC-chip voltages can easily be kept constant while the IC-chip power dissipation changes.

One preferred embodiment of the above IC-chip testing apparatus is disclosed in U.S. patent application Ser. No. 09/511,789 which is assigned to the assignee of the present invention. In that IC-chip testing apparatus, a motorized mechanism is provided which moves the IC-chip holding subassembly between an "initial" position (also called the "open" position) and a "test" position (also called the "closed" position). In the initial or open position, the IC-chip holding subassembly is spaced-apart from the power converter subassembly and the temperature regulating subassembly; and that enables the IC-chip holding subassembly to be inserted into/removed from the IC-chip testing apparatus. In the test or closed position, the IC-chip holding subassembly is squeezed between the power converter subassembly and the temperature regulating subassembly; and there, the IC-chips are actually tested.

To operate the motorized mechanism, an electronic control circuit can be included which senses when the IC-chip holding subassembly is at the initial position, or at the test position; and which automatically stops the motor in response. However, the present inventors have found that damage to the IC-chip testing apparatus can occur even when this electronic control circuit is included. For example, the sensors which are provided for sensing the initial position and test position of the IC-chip holding subassembly can fail; or, the sensors can become misaligned. Also, wiring errors can be made, by factory workers, when the IC-chip testing apparatus is manufactured.

When any one of the above types of problems do occur, the resulting damage can be catastrophic because the motor needs to be quite powerful in order to squeeze all of the subassemblies together. Accordingly, a primary objective of the present invention is to provide an integrated circuit tester having a fail-safe mechanism for moving IC-chips which avoids the above problems.

BRIEF SUMMARY OF THE INVENTION

In accordance with the present invention, an integrated circuit tester includes a fail-safe mechanism for moving an integrated circuit chip between an initial position where the integrated circuit chip is inserted into the tester, and a test position where the integrated circuit chip is actually tested. One preferred embodiment of this fail-safe mechanism for moving includes –1) a motor; 2) a shaft, coupled to the motor, which has a threaded section that the motor rotates; 3) a threaded member which travels linearly along the threaded section of the shaft when the shaft is rotated by the motor; 4) a lifter arm, coupled to the threaded member, that moves between predetermined first and second positions in response to the linear travel of the threaded member; 5) a linkage means, coupled between the lifter arm and the integrated circuit chip, which places the integrated circuit chip at the initial position and the test position as the lifter arm moves to the first and second positions respectively; and, 6) the shaft has first and second unthreaded sections, adjacent to opposite ends of the threaded section, onto which the threaded member linearly travels and stops if the shaft fails to stop rotating when the lifter arm respectively reaches the first and second positions.

The above fail-safe mechanism can be used together with any electronic control circuit for automatically stopping the motor when the integrated circuit chip is at its initial position, or at its test position. If that electronic control circuit fails such that the motor continues to rotate the shaft when the chip reaches the initial position, or the test position, then no catastrophic damage to the integrated circuit tester will occur. That is because when the above failure occurs, the threaded member will linearly travel onto an unthreaded section of the shaft; and that will stop the lifter arm from moving.

BRIEF DESCRIPTION OF THE DRAWINGS

FIG. 1A shows the top portion of an integrated circuit tester which incorporates the present invention.

FIG. 1B shows the bottom portion of the integrated circuit tester whose top portion is shown in FIG. 1A.

FIG. 1C shows the details of a chip holding subassembly, a power converter subassembly, and a temperature regulating subassembly which occur multiple times within the integrated circuit tester of FIGS. 1A–1B.

FIG. 2A schematically shows the three subassemblies of FIG. 1C being held in an "open" position within the integrated circuit tester of FIGS. 1A–1B.

FIG. 2B schematically shows the three subassemblies of FIG. 1C being held in a "closed" position within the integrated circuit tester of FIG. 1A–1B.

FIG. 3 shows the details of a fail-safe drive mechanism which is included within the integrated circuit tester of FIGS. 1A–1B and which is structured in accordance with the present invention.

DETAILED DESCRIPTION

Figure 4A:
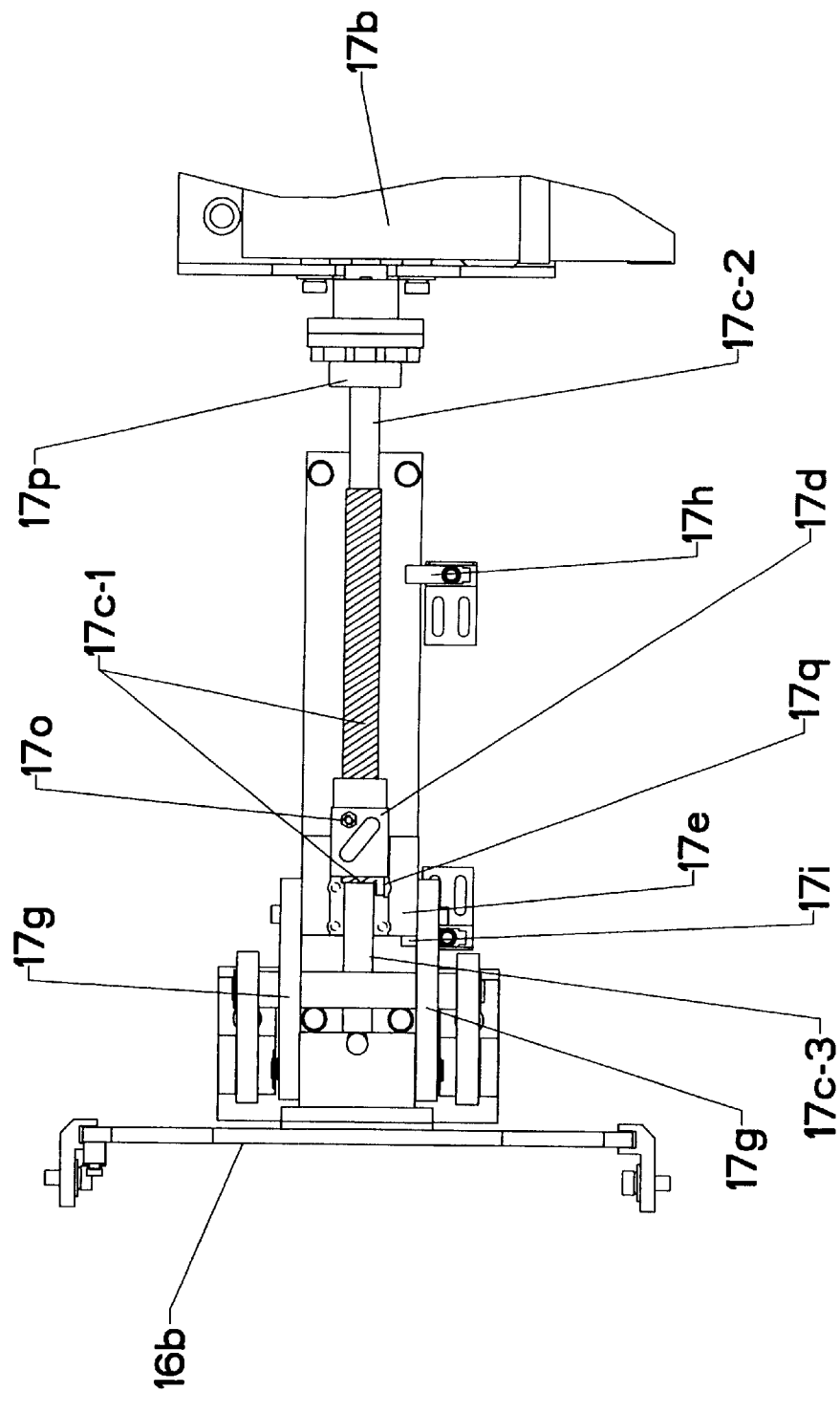
FIG. 4A is a top view of the left half of the fail-safe drive mechanism of FIG. 3, which shows the positions of several components in that mechanism which occur when the three subassemblies of FIG. 1A are in the "closed" position as shown in FIG. 2A.

An overview of one preferred embodiment of an integrated circuit tester 10 which incorporates the present invention is illustrated by the combination of FIGS. 1A–1C and 2A–2B; and, this description begins with those figures. Thereafter, the details of the present invention will be described in conjunction with FIGS. 3 and 4A–4D.

The integrated circuit tester 10 of FIGS. 1A–1C and 2A–2B is comprised of seven different types of subassemblies 11–17. Each subassembly includes several components; and all of the components of any one particular subassembly are identified by the same reference numeral with a different letter appended to it. For example, components 11a–11g are in subassembly 11. Each subassembly 11–17, and their respective components, will now be described.

Subassembly 11 is a frame that includes components 11a–11g. Component 11a is a horizontal base of the frame which has several legs 11b that are rigidly connected to the base 11a. Components 11c–11f are four vertical columns which are rigidly connected to the base 11a. Component 11g is a top of the frame which is rigidly connected to the columns 11c–11f.

Subassembly 12 is a chip holding subassembly which includes components 12a–12d. From one to fourteen of these chip holding subassemblies 12 are held by the frame 11. Component 12a is a printed circuit board which has one face 12a-1 and an opposite face 12a-2. Face 12a-2 is seen only in FIGS. 2A–2B, and attached to it are N sockets 12b, each of which holds one IC chip 12c that is to be tested. Here, N is any desired number, such as sixteen or thirty for example. Attached to face 12a-1 are N sets of electrical contacts 12d, and each set carries all of the electrical power and all signals for one of the chips 12c. Each socket 12b is connected to one set of contacts 12d by microscopic conductors (not shown) that pass thru the printed circuit board 12a.

Subassembly 13 is a power converter subassembly which includes components 13a–13c. A separate power converter subassembly 13 is held by the frame 11 above each chip holding subassembly 12. Component 13a is a printed circuit board which has one face 13a-1 and an opposite face 13a-2. Face 13a-2 is seen only in FIGS. 2A–2B, and attached to it are N sets of electrical contacts 13b, each of which mates with one set of the contacts 12d on the chip holding subassembly 12. Attached to face 13a-1 are N DC-DC power converters 13c. Each power converter 13c supplies power to one set of the contacts 13b, and it is connected to those contacts by microscopic conductors (not shown) that pass through the printed circuit board 13a.

Subassembly 14 is a temperature regulating subassembly which includes components 14a–14d. A separate temperature regulating subassembly 14 is held by the frame 11 below each chip holding assembly 12. Component 14a is a flat rigid plate which has one face 14a-1 and an opposite face 14a-2. Attached to face 14a-1 are N springy components 14b, and each springy component 14b holds one temperature regulating component 14c such that it is aligned with one chip 12c in the chip holding assembly 12.

Each temperature regulating component 14c can be of a type which removes heat from the chips 12c by conduction, such as a heat sink; or it can be of a type which adds heat to the chips 12c by conduction, such as an electric resistor; or it can be a combination of both types. Several stops 14d are attached to the face 14a-1, and they are aligned with the spaces between the sockets 12b in the chip holding assembly 12.

These stops 14d limit the force with which the temperature regulating components 14c can be pressed against the chips 12c. This is achieved by limiting the amount by which the springy components 14b get compressed when the subassemblies 12–14 are squeezed together. Preferably, the stops 14d have a length which is selectable within a predetermined range so that the temperature regulating components 14c are pressed against the chips 12c with a force that can be adjusted up or down.

Subassembly 15 is a pressing mechanism which presses the subassemblies 12, 13 and 14 together. In order to press those subassemblies 12–14 together, the power converter subassembly 13 is held stationary in the frame 11, and the pressing mechanism 15 moves the temperature regulating subassembly 14 upward. This upward movement causes the chip holding subassembly 12 to be squeezed between the temperature regulating subassembly 14 and the power converter subassembly 13.

For each chip holding subassembly 12 that is held in the frame 11, two copies of the pressing mechanism 15 are provided. One copy is held in the frame by columns 11c and 11d, while the other copy is held in the frame by columns 11e and 11f.

Subassembly 16 is a mechanical coupling between all of the pressing mechanisms 15 which are in the frame 11, and it includes components 16a–16b. Component 16a is a plate which moves up and down in the frame between columns 11c and 11d. Component 16b is identical to plate 16a, and it moves up and down in the frame between columns 11e and 11f. Plate 16a has a separate pair of slots 16a-1 for each pressing mechanism 15 that is held by the frame columns 11c and 11d, and plate 16b has a separate pair of slots 16b-1 for each pressing mechanism 15 that is held by the frame columns 11c and 11f.

As the plates 16a and 16b move up and down, the slots 16a-1 and 16b-1 act as tracks which cause all of the pressing mechanisms 15 to move. When the plates 16a and 16b move down, the pressing mechanisms 15 move to a position where the subassemblies 12, 13 and 14 are spaced-apart. This position is herein called the "open" position or the "initial" position. Conversely, when the plates 16a and 16b move up, the pressing mechanisms 15 move to another position where the subassemblies 12, 13 and 14 are pressed together. This position is herein called the "closed" position or the "test" position FIG. 2A schematically shows how the subassemblies 12, 13 and 14 are held in the frame 11 in the open position. There, each chip holding subassembly 12 is spaced-apart from one corresponding power converter subassembly 13 and the corresponding temperature regulating subassembly. Thus, in the open position, each chip holding subassembly 12 can be initially inserted into the frame 11. Also in the open position, any chip holding subassembly that was previously inserted can be removed and replaced with another chip holding subassembly 12.

By comparison, FIG. 2B schematically shows how the subassemblies 12, 13 and 14 are held in the frame 11 in the closed position. There, each chip holding subassembly 12 is squeezed between one corresponding power connector subassembly 13 and one corresponding temperature regulating subassembly 14. While the chip holding subassembly 12 is in the closed position, the chips 12c on the chip holding subassembly 12 are actually tested.

Included within the pressing mechanism 15 are components 15a–15g as shown in FIGS. 2A–2B. Component 15a is a rail which is rigidly attached to the frame columns 11e and 11f. This rail 15a lies below the temperature regulating subassembly 14 and is parallel to face 14a-2 of the plate 14a. Components 15b and 15c are a pair of arms that are coupled together with a pivotal joint 15d which presses against face 14a-2 of the plate 14a. These arms 15b and 15c also have slidable joints 15e and 15f which slide on the rail 15a. Component 15g is a spring which is coupled between the slidable joint 15f and the frame 11. All of the components 15b–15g are duplicated in the pressing mechanism 15 as shown.

Both of the slidable joints 15e fit into one pair of the slots 16b-1 in the plate 16b. The slots 16b-1 of each pair are close together at their top and far apart at their bottom. Thus, as the plate 16b moves down, the joints 15e slide close together to an "open" position of FIG. 2A. There, the angle "A" between each pair of arms 15b and 15c is large; and so the pivotal joints 15d have moved down. Consequently, the three subassemblies 12, 13, and 14 are spaced apart from each other.

Conversely, as the plate 16b moves up, the joints 15e slide far apart to a "closed" position of FIG. 2B. There, the angle "A" between each pair of arms is small; and so the pivotal joints 15d have moved up. Consequently, the three subassemblies 12, 13, and 14 are squeezed together.

Subassembly 17 is a fail-safe drive mechanism which moves the plates 16a–16b up and down; and, this fail-safe drive mechanism is structured in accordance with the present invention. Included in the fail-safe drive mechanism 17 are components 17a–17p. Only a few of those components 17a–17p can be seen in FIG. 1A; but, all of those components are shown in FIG. 3. Each of the components 17a–17p will now be described in conjunction with FIG. 3; and thereafter, how those components interact will be described in conjunction with FIGS. 4A–4D.

Component 17a is an electric motor. Component 17b is a set of gears that are enclosed within a housing and which are connected to the motor 17a. Component 17c is a shaft which occurs twice in FIG. 3 and which is connected as shown to the right and left sides of the gears 17b.

Component 17d is a ball-nut which occurs twice in FIG. 3. One ball-nut 17d encircles the shaft 17c which is on the left side of the gears 17b, and the other ball-nut 17d encircles the shaft 17c which is on the right side of the gears 17b. Each ball-nut 17d travels linearly along the particular shaft 17c which it encircles in response to the rotation of that shaft.

Component 17e is a saddle which occurs twice in FIG. 3. Each saddle 17e has an upper groove into which one respective ball-nut 17d snuggly fits, as shown.

Component 17f is a linear track which occurs twice in FIG. 3. Each saddle 17e has a lower groove which rides on a respective one of the linear tracks 17f, as shown. The two saddles 17e move on the tracks 17f either towards each other, or away from each other, in unison.

Component 17g is a lifter arm which occurs twice in FIG. 3. One lifter arm 17g is connected between the plate 16a and the saddle 17e on the right side of the gears 17b, as shown. The other lifter arm 17g is connected between the plate 16b and the saddle 17e on the left side of the gears 17b, as shown. When the two saddles 17e move away from each other, the lifter arms 17g move the plates 16a and 16b upwards. Conversely, when the two saddles 17e move towards each other, the lifter arm 17g move the plates 16a and 16b downward.

Component 17h is an electronic sensor which senses when the two lifter arms 17g are in a predetermined "down" position. This predetermined down position of the lifter arms 17g occurs when the subassemblies 12, 13 and 14 are in the "open" position as shown in FIG. 2A. To sense this predetermined down position, only one sensor 17h is needed because the two lifter arms 17g are moved by the saddles 17e, in unison.

Component 17i is an electronic sensor which senses when the two lifter arms 17g are in a predetermined "up" position. This predetermined up position of the lifter arms 17g occurs when the subassemblies 12, 13 and 14 are in the "closed" position as shown in FIG. 2B. Here again, only one sensor 17i is needed because the two lifter arms 17g are moved by the saddles 17e, in unison.

Components 17j and 17k are signal lines which carry electrical signals from the electronic sensors 17h and 17i, respectively. These signals indicate when the sensors 17j and 17k have detected the down and up positions of the lifter arms 17g.

Component 17l is an electronic control circuit for the motor 17a which has three input signal lines 17j, 17k, and 17m, and which has one output signal line 17n. The input signal line 17m connects to a remote control panel (not shown) from which an operator can send commands on the signal line 17m which indicate that the lifter arms 17g should be moved to the predetermined "up" position or the predetermined "down" position.

Component 17o is a stand-off, which occurs twice in FIG. 3. Each stand-off 17o extends from a respective one of the two ball-nuts 17d, as shown.

Component 17p is a magnet, which occurs twice in FIG. 3. Each magnet 17p is attached to one end of a respective shaft 17c, as shown. The ends of the shafts to which the magnets 17p are attached are the ends that are next to the gears 17b.

Lastly, component 17q is a shear pin which lies in the top groove of the saddle 17e.

Now, with reference to FIGS. 4A–4D, the manner in which the fail-safe drive mechanism 17 operates will be described in detail. In those FIGS. 4A–4D, all of the components in the fail-safe drive mechanism 17 which are on the left side of the gears 17b, are shown in four different positions. The corresponding components on the right side of the gears 17b, have identical positions on the right side of the gears 17b so that the two lifter arms 17g move the plates 16a–16b up and down, in unison.

In FIG. 4A, the illustrated positions of the fail-safe drive mechanism components, occur when the lifter arms 17g are at the predetermined "up" position. By comparison, in FIG. 4B, the illustrated positions of the fail-safe drive mechanism components occur when the lifter arms 17g are at the predetermined "down" position.

Figure 4B:
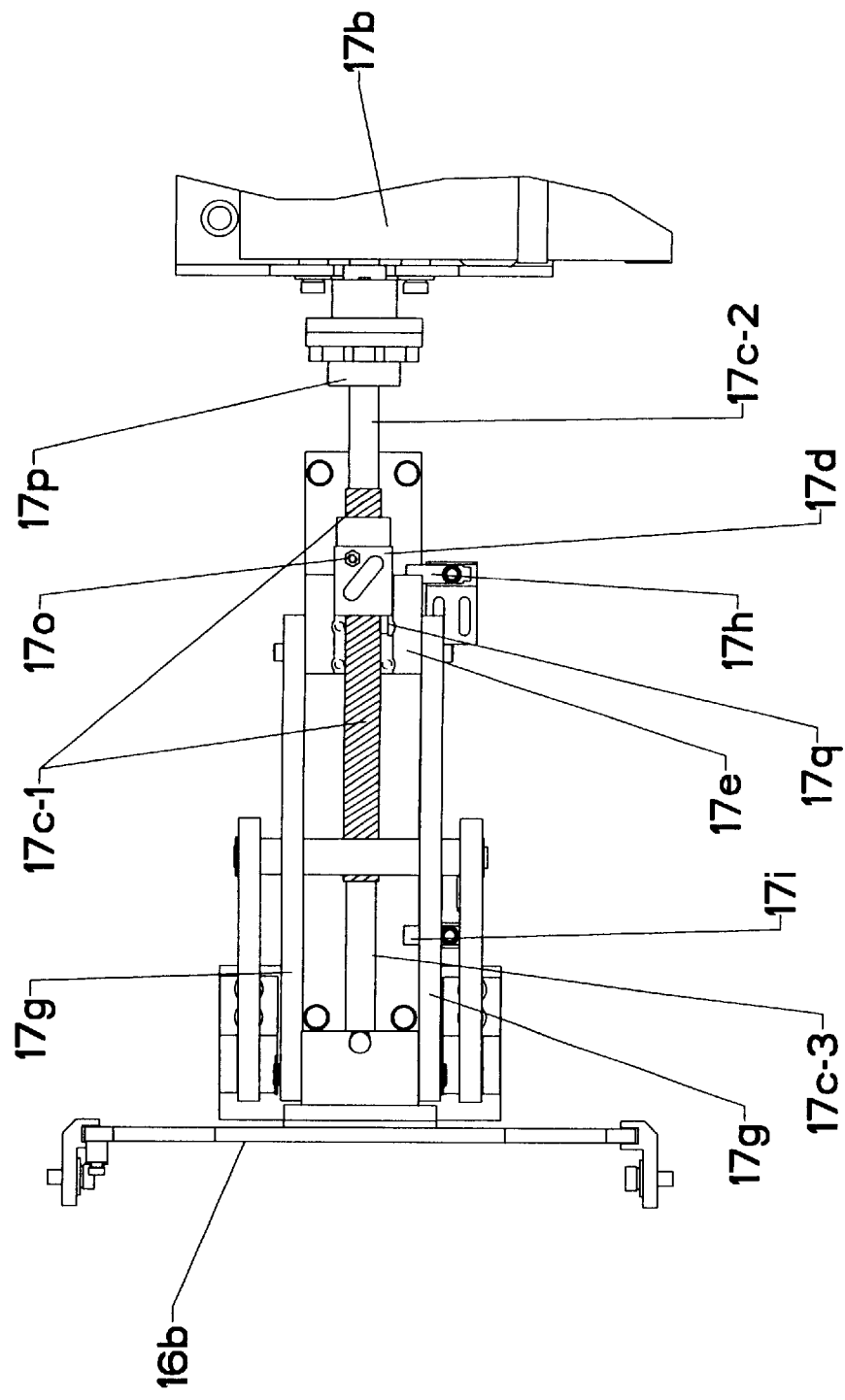
FIG. 4B is a top view of the left half of the fail-safe drive mechanism of FIG. 3, which shows the positions of several components in that mechanism which occur when the three subassemblies of FIG. 1C are in the "open" position as shown in FIG. 2A.
Figure 4C:
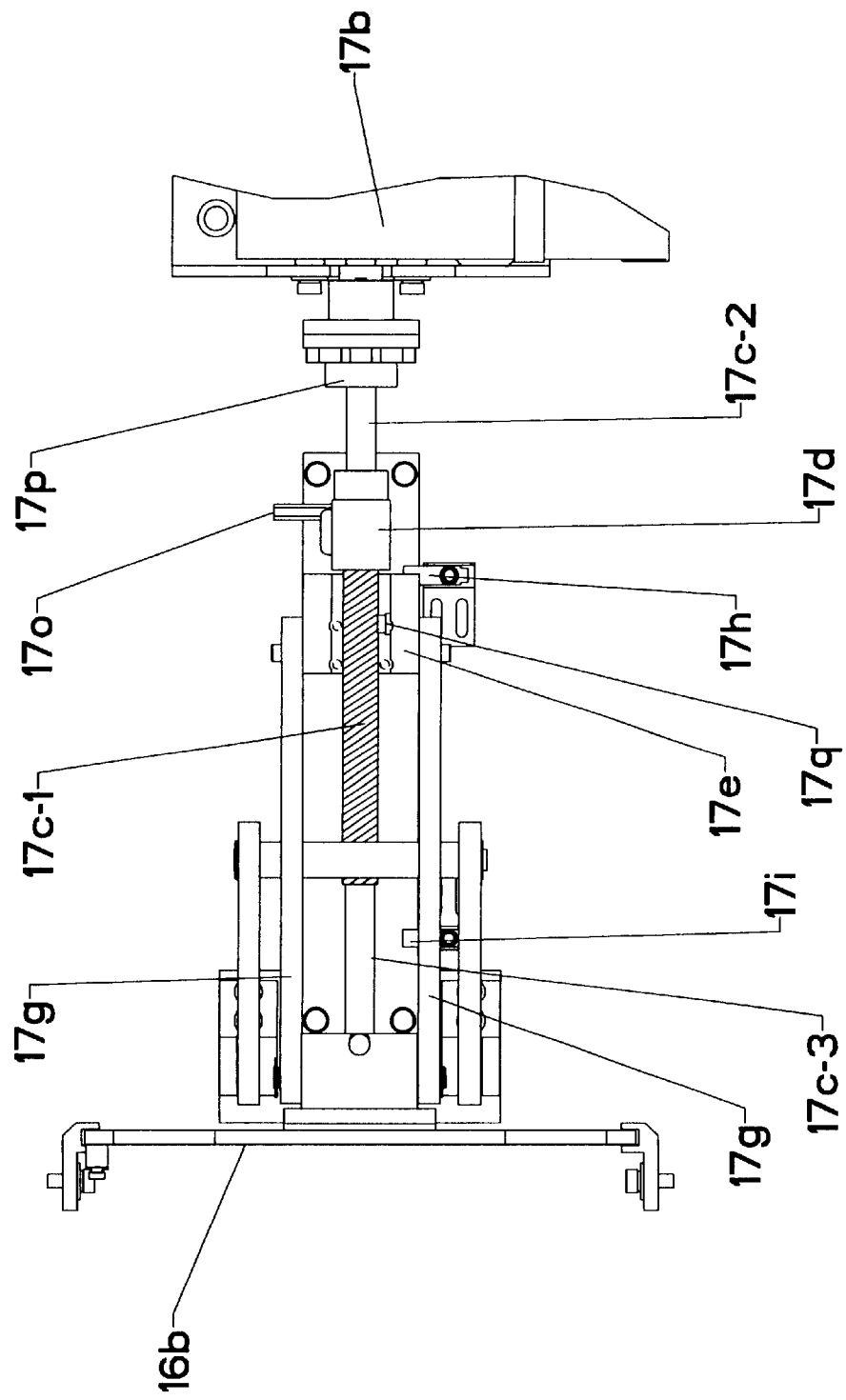
FIG. 4C is a top view of the left half of the fail-safe drive mechanism of FIG. 3, which shows the positions of several components in that mechanism which occur in accordance with one particular fail-safe aspect of the present invention.
Figure 4D:
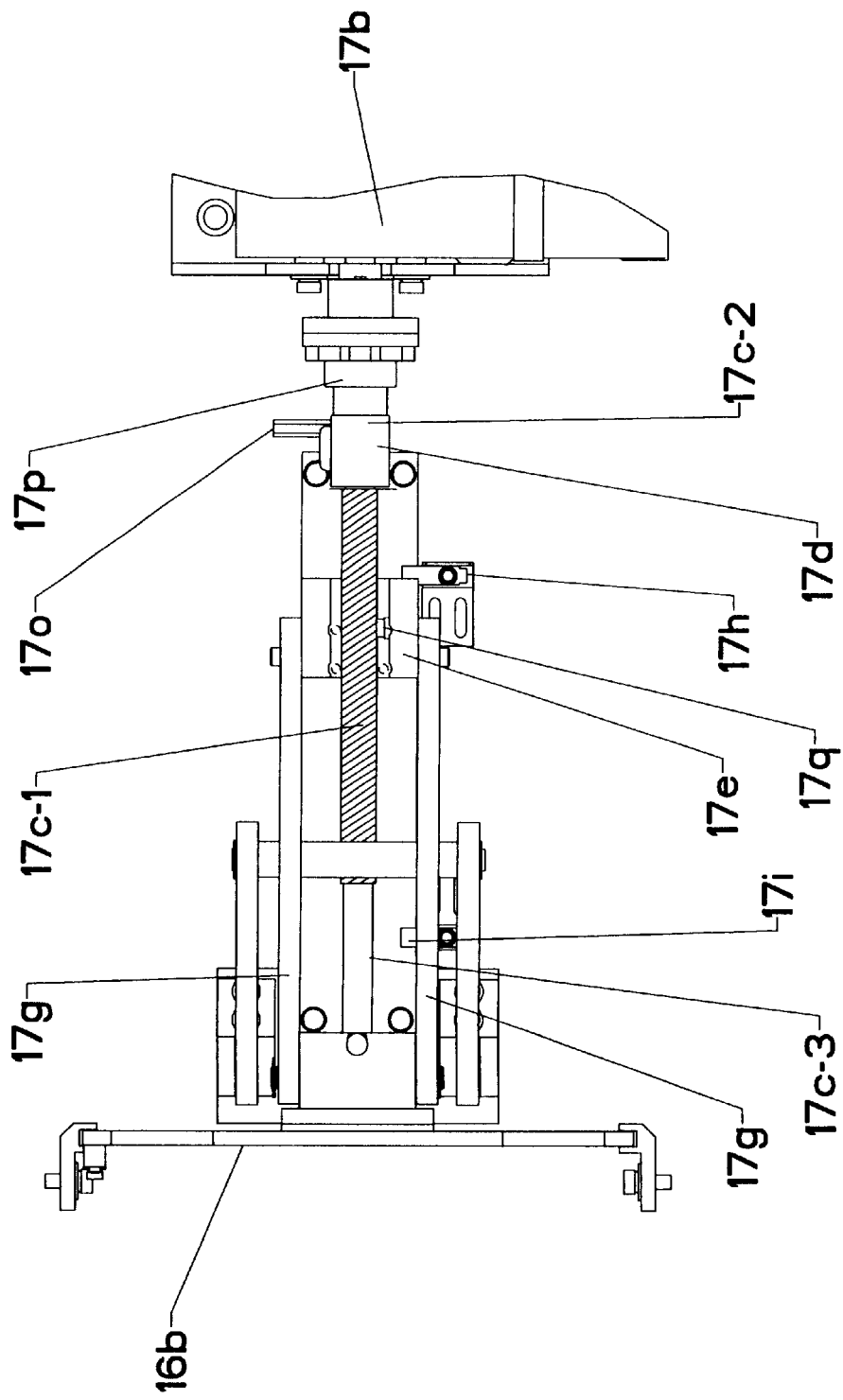
FIG. 4D is a top view of the left half of the fail-safe drive mechanism of FIG. 3, which shows the positions of several components in that mechanism which occur in accordance with another fail-safe aspect of the present invention.

Under normal operating conditions, the components in the fail-safe drive mechanism 17 only move from their positions of FIG. 4A to their positions of FIG. 4B; and vice-versa. But, if the control circuit 17l fails, or the sensors 17b–17i are misaligned, the motor 17a can continue to rotate the shaft 17c after the positions of FIGS. 4A–4B are reached. In that event, the fail-safe aspect of the drive-mechanism 17 comes into play; and FIGS. 4C–4D illustrates two successive positions of the fail-safe drive mechanism components which occur when the motor 17a continues to rotate the shaft 17c after the predetermined "down" position of FIG. 4B is reached. Inspection of the FIGS. 4A–4D shows that the shaft 17c is partitioned into three sections 17c-1, 17c-2, and 17c-3. Section 17c-1 is threaded; and those threads cause the ball-nut 17d to move linearly along the shaft when the shaft is rotated by the motor 17a. To move the ball-nut 17d from its position in FIG. 4A to its position in FIG. 4B, the shaft 17c is rotated clockwise; and, to move the ball-nut 17d from its position in FIG. 4B to its position in FIG. 4A, the shaft 17c is rotated counter-clockwise.

By comparison, sections 17c-2 and 17c-3 of the shaft are unthreaded; and those unthreaded sections are adjacent to opposite ends of the threaded section 17c-1, as shown. If the shaft 17 continues to rotate counter-clockwise after the ball-nut 17d reaches its FIG. 4B position, then the ball-nut 17d will move out of the saddle 17e and move from the threaded section 17c-1 onto the unthreaded section 17c-2. This is shown in FIG. 4C.

When the ball-nut 17d reaches the unthreaded section 17c-2 of the shaft as shown in FIG. 4C, an attractive force is exerted on the ball-nut 17d by the magnet 17p. Also, the ball-nut 17d is free to slide on the unthreaded section 17c-2. Consequently, the ball-nut 17d slides to the magnet 17p as is shown in FIG. 4D.

Once the ball-nut 17d has slid to the magnet 17p, the ball-nut 17d cannot move back into the saddle 17e without manual intervention. This is desired because it ensures that the drive mechanism 17 cannot be used to press more of the subassemblies 12, 13, and 14 together until the fault which caused its improper operation is fixed.

To enable the ball-nut 17d to disengage from the saddle 17e, those two components are not permanently fastened to each other. Instead, the ball-nut 17d slides halfway through the top groove of the saddle 17e as shown in FIGS. 4A and 4B; and then, the ball-nut 17d hits an obstruction 17q in the top groove. As one example, the obstruction 17q can be a shear pin.

When the ball-nut 17d moves between its positions in FIGS. 4A and 4B, the ball-nut 17d tries to move away from the obstruction 17q; but as that occurs the saddle 17e follows the ball-nut due to the force exerted by the weight of the plate 16b and the subassemblies 12–14. By comparison, when the ball-nut 17d moves from its position in FIGS. 4B to its position in 4C, the ball-nut 17d separates from the saddle. This is because the saddle 17e is connected to the lifter arms 17g, and the lifter arms 17g hit the tracks 17f and stop when the saddle is at its position of FIG. 4B.

Also, while the ball-nut 17d and the saddle 17e travel between their positions of FIGS. 4A and 4B, the ball-nut 17d hits the sides of the top groove in the saddle; and thus, the ball-nut 17d cannot rotate when the shaft 17c rotates. But when the ball-nut 17d is out of the saddle 17e and in its position of FIG. 4C, the saddle cannot stop the ball-nut 17d from rotating. Thus, to stop such rotations, the stand-off 17c is provided. If the ball-nut starts to rotate, the stand-off 17c will also rotate and hit the tracks 17f after just one-quarter turn. Then, the ball-nut 17d will continue to travel linearly from the threaded section of the shaft 17c-1 to the unthreaded section 17c-2. Now, consider the case where the motor 17a is moving the lifter arms 17g from their predetermined down position of FIG. 4B to their predetermined up position of FIG. 4A; and, suppose that the motor 17a fails to stop rotating the shaft 17c counter-clockwise when the predetermined up position of FIG. 4A is reached. Such a failure can occur if the control circuit 17l operates improperly, or the sensor 17k is misaligned.

If the shaft 17c continues to rotate counter-clockwise when the lifter arms 17g reach their predetermined up position, then the ball-nut 17d will continue to travel linearly along the threaded section of the shaft 17c-1 to the unthreaded section 17c-3. When the ball-nut 17d reaches the unthreaded section 17c-3, then the ball-nut 17d stops moving; and consequently, the saddle 17e, the lifter arms 17g, and the plates 16c–16b all stop moving.

Due to the above action, the motor 17a induces only limited mechanical stresses and strains into the lifter arms 17g, the plates 16a–16b, and the subassemblies 12–14. Without such limitations, the lifter arms 17g and/or the plates 16a–16b and/or the subassemblies 12–14 could become bent or otherwise destroyed.

After the ball-nut 17d travels onto the unthreaded section of the shaft 17c-3, that ball-nut 17d will travel linearly back onto the threaded section 17c-1 when the shaft is rotated clockwise. This is desired because it enables the lifter arms 17g to be moved back to their predetermined "down" position of FIG. 4B. In that position, the subassemblies 12–13 are spaced-apart; and, the mechanical stresses and strains which are exerted on the plates 16a–16b and the lifter arms 17g are minimal.

One preferred embodiment of the present invention has now been described in detail. In addition, however, various changes and modifications can be made to the details of this preferred embodiment without departing from the essence of the invention; and some examples of such modifications will now be described.

As one modification, the electronic control circuit 171 in FIG. 3 can be eliminated; and instead, the motor 17a can be started and stopped manually by an operator. With this modification, the signals from the remote control panel (not shown) which is connected to the signal line 17m in FIG. 3, would be sent directly to the motor 17a.

As another modification, the plates 16a–16b of FIGS. 1A and 1B, and the pressing mechanism 15 of FIGS. 1B, 2A and 2B, which together link the lifter arms 17g to the subassemblies 12–14 of FIGS. 1C, 2A and 2B, can be replaced with various other types of linkage means. Similarly, the subassemblies 12–14 of FIGS. 1C, 2A and 2B can be replaced with various other means for holding the integrated circuit chips 12c that are tested.

Also, as another modification, the ball-nut 17d, which is in the fail-safe mechanism of FIG. 3, can be replaced with any other type of threaded member which will travel linearly on the shaft 17c as shown in FIGS. 4A–4D. Likewise, the magnet 17p which is in the fail-safe mechanism of FIG. 3, can be replaced with any other type of retainer means which will hold onto the ball-nut 17d as shown in FIG. 4D.

Accordingly, it is to be understood that the present invention is not limited to just the details of the illustrated preferred embodiment but is defined by the appended claims.

What is claimed is:

1. An integrated circuit tester which includes a fail-safe mechanism for moving an integrated circuit chip between an initial position where said integrated circuit chip is inserted into said tester and a test position where said integrated circuit chip is actually tested; said fail-safe mechanism for moving being comprised of: a motor; a shaft, coupled to said motor, which has a threaded section that said motor rotates; a threaded member which travels linearly along said threaded section of said shaft when said shaft is rotated by said motor; a lifter arm, coupled to said threaded member, that moves between predetermined first and second positions in response to said linear travel of said threaded member; a linkage means, coupled between said lifter arm and said integrated circuit chip, which places said integrated circuit chip at said initial position and said test position as said lifter arm moves to said first and second positions respectively; and, said shaft having first and second unthreaded sections, adjacent to opposite ends of said threaded section, onto which said threaded member linearly travels and stops if said shaft fails to stop rotating when said lifter arm respectively reaches said first and second positions.

2. An integrated circuit tester according to claim 1 wherein said lifter arm is coupled to said threaded member such that –a) said threaded member constantly pushes against said lifter arm as said lifter arm moves between said first and second positions, and –b) said threaded member completely separates from said lifter arm if said shaft continues to rotate after said lifter arm reaches said first position.

3. An integrated circuit tester according to claim 2 wherein said threaded member has a means that prevents said threaded member from rotating on said shaft when said threaded member has separated from said lifter arm.

4. An integrated circuit tester according to claim 3 wherein said means that prevents said threaded member from rotating is a stand-off that extends from said threaded member.

5. An integrated circuit tester according to claim 1 which further includes a retainer means which prevents said threaded member from traveling back onto said threaded section of said shaft after said threaded member travels from said threaded section to said first unthreaded section.

6. An integrated circuit tester according to claim 5 wherein said retainer means includes a magnet which magnetically holds said threaded member in place when said threaded member travels onto said first unthreaded section of said shaft.

7. An integrated circuit tester according to claim 1 wherein said lifter arm is coupled to said threaded member by a saddle which has a groove that holds said threaded member.

8. An integrated circuit tester according to claim 7 wherein said groove in said saddle holds a shear pin against which said threaded member pushes.

9. An integrated circuit tester according to claim 1 wherein said threaded member is a ball-nut which encircles said shaft.

10. An integrated circuit tester according to claim 1 which further includes an electronic control circuit for automatically stopping said motor from rotating said shaft when said lifter arm is at said first and second positions, but which is subject to failure.

* * * * *